United States Patent [19]

Sorensen

[11] Patent Number: 4,774,467

[45] Date of Patent: Sep. 27, 1988

[54] METHOD FOR RECORDING NUCLEAR MAGNETIC RESONANCE SPECTRA

[75] Inventor: Ole W. Sorensen, Zürich, Switzerland

[73] Assignee: Spectrospin AG, Switzerland

[21] Appl. No.: 937,949

[22] Filed: Dec. 4, 1986

[30] Foreign Application Priority Data

Dec. 6, 1985 [DE] Fed. Rep. of Germany ....... 3543123

[51] Int. Cl.$^4$ ............................................. G01R 33/20
[52] U.S. Cl. ..................................... 324/311; 324/309
[58] Field of Search ............... 324/307, 308, 309, 311, 324/310, 314

[56] References Cited

U.S. PATENT DOCUMENTS

| 4,238,735 | 12/1980 | Muller | 324/310 |
| 4,345,207 | 8/1982 | Bertrand et al. | 324/308 |
| 4,510,449 | 4/1985 | Ernst et al. | 324/309 |
| 4,521,732 | 6/1985 | Pegg et al. | 324/308 |

FOREIGN PATENT DOCUMENTS 3143625  11/1981  Fed. Rep. of Germany .

OTHER PUBLICATIONS

Bax and Freeman, J.Magn.Reson., 1981, 44, 542.
Griesinger, Sorensen and Ernst, J.Am.Chem.Soc., 1985, 107, 6394–6396.
ETH Dissertation No. 7658, Sorensen, Modern Pulse Techniques in Liquid State Nuclear Magnetic Resonance Spectroscopy, 1984.

*Primary Examiner*—Stewart J. Levy
*Assistant Examiner*—Kevin D. O'Shea
*Attorney, Agent, or Firm*—Pennie & Edmonds

[57] ABSTRACT

To eliminate homonuclear couplings along the $\omega_1$ axis in 2D spectroscopy, a time reversal pulse (5, 6) is inserted into the pulse sequence that is generally employed for experiments of this type, which time reversal pulse divides the evolution period $t_1$ that is required for experiments of this type into two equal portions. The time reversal pulse is intended to cause the spin moments to rotate about an angle $\beta_n$ and is preferably composed of two 90° pulses, the first of which has a phase of $\beta_n + \phi_q$ and the second a phase of $\pi + \phi_q$. The phase of the RF oscillation of the pulse that precedes the time reversal must be shifted by an angle of $\beta_n$. A plurality of $3(2N-1)$ of these signals having different phases are added together after being weighted by a factor which preferably amounts to $$W_n = \frac{N}{8}(-1)^n \left[\cos\left(\frac{n\pi}{2N}\right)\right]^{-2}.$$

7 Claims, 3 Drawing Sheets

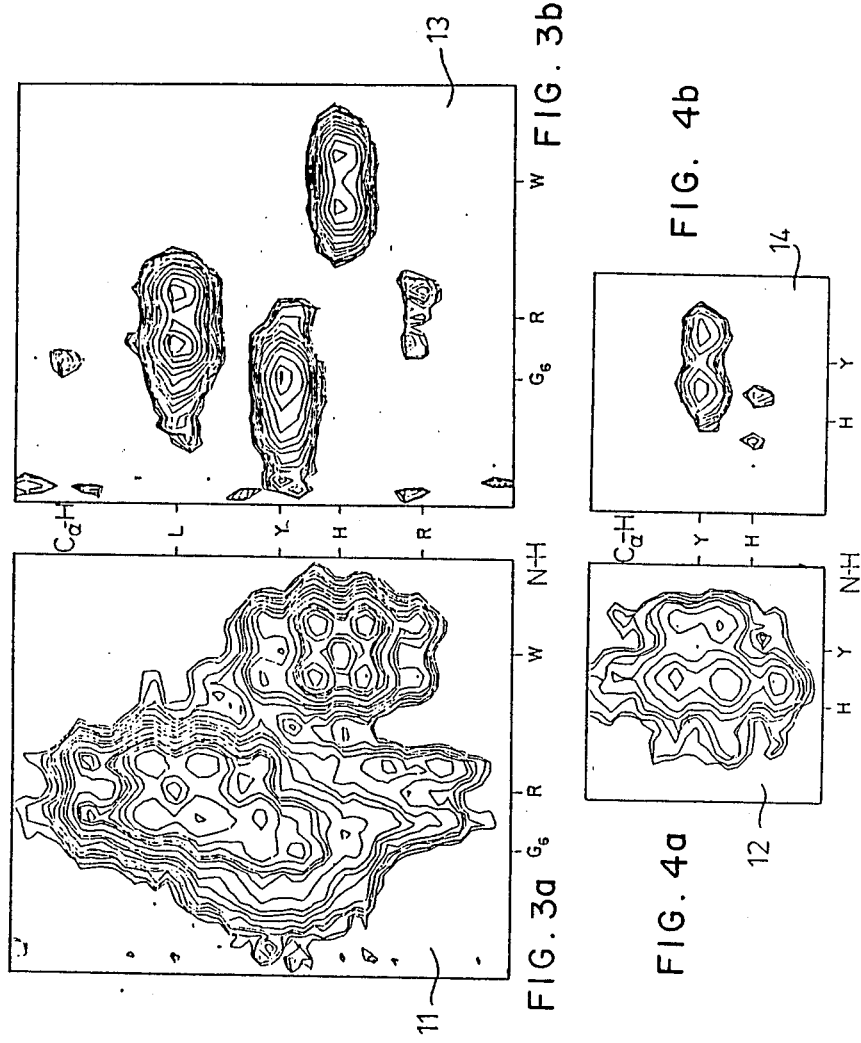

METHOD FOR RECORDING NUCLEAR MAGNETIC RESONANCE SPECTRA

The present invention relates to a method for recording the nuclear magnetic resonance spectra of molecular spin systems between which there is an interactive effect in which the spin systems are excited by means of a 90° pulse and the resonance signals of the excited spin systems are not observed until the end of an evolution period $t_1$ that follows the 90° pulse.

There are frequently couplings between the spins of complicated molecules, which cause splitting of the lines of an NMR spectrum. Although line splitting of this type provides valuable information regarding the couplings that exist, and thus regarding molecular structure, it can also seriously impede analysis of a spectrum, because it is possible for the multiplets that are produced by line splitting to overlap, which means that it is no longer readily possible to allocate the individual lines. In the case of 2D spectroscopy, interactive effects produce so-called cross peaks. Interpretation of the spectrum is greatly impeded if groups of cross peaks overlap. While various methods are known for eliminating disturbing, coupling-produced lines from 2D spectra (cf. German Disclosed Patent Application No. 3,143,625), it has thus far not yet been possible to provide general elimination of the effects of a scalar spin-spin coupling that occurred during the evolution period $t_1$, i.e. to achieve homonuclear decoupling in the $\omega_1$ frequency axis. While the constant time experiment described by Bax and Freeman in J. Magn. Reson., 1981, 44, 542, does enable decoupling to be effected, this method suffers from the strong dependency of the signal intensities upon the relaxation times and the J coupling constants.

It is therefore the object of the present invention to provide a method for recording nuclear magnetic resonance spectra which permits evolutions that occur as a consequence of the scalar homonuclear spin-spin interactive effects in the presence of a J coupling to be refocussed, thereby eliminating the effects of the scalar spin-spin couplings during the evolution period with respect to the $\omega_1$ frequency axis.

According to the present invention, this object is solved in that the spin system is irradiated with a time reversal pulse after one half of the evolution period ($t_1/2$), with the time reversal pulse causing the spin moments to flip about a flip angle $\beta_n$ and their RF oscillation to have a phase shift of $\phi_q$ relative to a reference phase, while the RF oscillation of the 90° pulse that precedes the time reversal pulse, and possibly further RF pulses that are employed prior to the time reversal pulse, have a phase shift about an angle $\psi+\beta_n$, in which $\psi$ represents either 0 or $\pi$ and $\beta_n$ coincides with the flip angle of the time reversal pulse and is determined by the maximum number N of intercoupled spins in the spin system, in accordance with the equation $$\beta_n = n\frac{\pi}{N}$$

where $n = 0, 1, 2, \ldots, N-1, N+1, \ldots 2N-1$
while $\phi_q$ assumes one of the values $$\phi_q = q\frac{2\pi}{3}$$

where $q = 0, 1, 2$, independently of $\beta_n$, and in that signals which were received on the basis of $3(2N-1)$ excitations, multiplied by a weighting factor of $$W_n = \tfrac{1}{2} B_o + \sum_{p=1}^{K} B_p \cos(p\beta_n) - \tfrac{1}{2} B_K \cos(K\beta_n) \delta_{K,N},$$

are added together to form a resulting signal whose weighting factor is the Fourier transformation of the factors $$B_p = \frac{(-1)^p}{12}(3p^2 - K^2 - \tfrac{1}{2}),$$

in which K represents the highest number of couplings that are actually present in the spin system and p represents a continuously changing whole number between 0 and K, which is why $$B_o = \frac{-(2K^2 + 1)}{24} \text{ and } B_K = (-1)^K \frac{(4K^2 - 1)}{24},$$

while $\delta_{K,N}$ has a value of 1 if $N=K$, and is otherwise zero.

In the method according to the present invention, signals S which are formed by totalling a plurality of different signals produced on the basis of the method according to the present invention are employed instead of the customary simple induction signals; these signals S are produced from the following equation, $$S = \sum_{n=0}^{2N-1}\left(W_n \cdot \sum_{q=0}^{2} s_{nq}\right),$$

in which $s_{nq}$ are individual induction signals that are obtained by varying n and q.

The method according to the present invention produces a chronological reversal of the evolution which occurs as a consequence of a scalar spin-spin coupling, with the result being homonuclear decoupling that does not possess the disadvantages of the constant-time experiment. Its principle is based upon the various dependencies of the various coherence transmission paths upon the flip angle $\beta$ of a time reversal flip that is inserted in a suitable location. The time reversal pulse, which hereinafter will also be termed the TR pulse or TR element, produces a unique selection of those transmission paths which cause a chronological reversal of the evolution that was brought about by the J coupling.

The conditions for a chronological reversal can easily be indicated in the form of the spin multiplet components, expressed in the form of product operators. For example, $$I_1{}^+ I_2{}^\alpha I_3{}^\beta$$

denotes a coherence of spin $I_1$ with coupling partners $I_2$ and $I_3$ in their $\alpha$ and $\beta$ states. A chronological reversal of the J evolution occurs when all passive spins ($I_2$, $I_3$) have been reversed by means of the indicated method, while the active spin ($I_1$) remains unaffected, i.e.

$$I_1{}^+ I_2{}^\alpha I_3{}^\beta$$

is transformed into $$I_1{}^+ I_2{}^\beta I_3{}^\alpha.$$

There is no single, non-selective twist which satisfies this requirement. However the method according to the present invention produces the desired effect, since it intercombines signals that were obtained through the employment of a TR pulse with a variable flip angle $\beta_n$; in the above-indicated case, there is a dependency of $\beta$, which is expressed by $$\cos^2(\beta/2)\sin^4(\beta/2).$$

To this extent, there is a certain relationship between the principle of the method according to the present invention and the so-called E. Cosy technique (ETH Dissertation No. 7658, 1984, and the J. Am. Chem. Soc., 1985, 107, 6394).

Although the method according to the present invention is of particular significance for homonuclear spin-spin decoupling (J decoupling) in conjunction with recording 2D spectrograms, it also enjoys general significance for chronological reversal of the evolutions caused by J couplings, and thus elimination of disturbing, J-caused signal attenuation. The method according to the present invention can be employed in a versatile manner in conjunction with investigation of biological macromolecules by means of NMR spectroscopy, where conventional NMR spectra would otherwise display regions in which there is strong overlapping of the resonances. Elimination of multiplet splitting, i.e. refocussing of the J evolutions, can eliminate this overlapping and consequently open up new spectral regions for interpretation. Possibilities of application also exist in conjunction with heteronuclear spin systems and in 2D exchange spectroscopy in general. In addition, the method can also be employed in conjunction with multiple quantum spectroscopy and in conjunction with indirect observation of magnetic resonance.

In a preferred embodiment of the method according to the present invention, the time reversal (TR) pulse is comprised of two portions, i.e. of a first portion in the form of a 90° pulse having a phase of $\beta_n+\phi_q$ and of a second portion, which follows the first portion, possibly at a brief chronological interval relative to the evolution period, in the form of a 90° pulse having a phase of $\pi+\phi_q$. $\tau$ is the time that is required to alter the RF phase. A typical value for $\tau$ would be $5.10^{-6}$ seconds. Implementation of the TR pulse by means of two portions in the form of 90° pulses of different phase position can be accomplished more precisely with conventional NMR spectrometers than generation of a pulse which, as a result of its energy content, is to produce a stipulated flip angle $\beta_n$ that differs from 90°.

As already indicated above, the method according to the present invention is especially suitable for employment in conjunction with recording 2D spectra. Consequently, a preferred embodiment of the method according to the present invention calls for employment of pulse sequences that are suitable for recording two-dimensional nuclear magnetic resonance spectra in which the time reversal pulse is inserted and in which the phase of the RF oscillation of the excitation pulse that precedes the time reversal pulse is shifted by angle $\beta_n$. Thus, for example, the pulse sequence $$90°(\beta+\psi_1)-\tfrac{1}{2}t_1-90°(\beta+\psi)-\tau-90°(\pi+\psi)-\tfrac{1}{2}t_1$$
$$-90°(0)-\tau_m-90°(\psi_2)-\text{acq.}\ (\psi_1+\psi_2),$$

where $\psi_1$ and $\psi_2$ represent phase angles 0 and $\tau$ in independent cyclical change, can be employed for NOESY (Nuclear Overhauser Enhancement SpectroscopY) experiments. This results in a minimum $12(2N-1)$ step phase cycle.

If the invention is employed in conjunction with a method for investigating spin systems with heteronuclear coupling, in which a first class of nucleus is directly excited by a first pulse sequence and the excitation of the second class of nucleus that resulted through coupling is then queried by means of a second pulse sequence, the time reversal pulse is inserted into the first pulse sequence. It is obvious that here, too, it will again be necessary for the corresponding phase shift of the pulses preceding the TR pulse to occur and that the experiments can be repeated with the change in the various angles provided for by the present invention, and that the signals which are obtained and multiplied by the indicated weighting factor must be added together in order to obtain the signal that is free of the coupling.

Indirect investigation of spin systems with heteronuclear coupling can be performed in the known manner by exciting a first class of nucleus by means of a first pulse sequence and a second class of nucleus by means of a second pulse sequence in such a manner that a first 180° pulse following a first 90° pulse of the first pulse sequence is centered between two 90° pulses of the second pulse sequence. In the case of this kind of method, the present invention can be employed in such a manner that the time reversal pulse is inserted in the first pulse sequence in a location that is chronologically in coincidence with the second 90° pulse of the second pulse sequence, in that the time reversal pulse is followed by a further 180° pulse at a chronological interval that is identical to the chronological interval between the first 90° pulse and the first 180° pulse, and in that scanning of the resonance signal provided by the first class of nucleus occurs at a chronological interval from the further 180° pulse that is identical to the chronological interval between the first 180° pulse and the time reversal pulse, so that the time reversal pulse is centered between the first 90° pulse and commencement of signal scanning.

The above discussed and other objects, features and advantages of the present invention will become more apparent from the following description thereof, when taken in connection with the practical examples shown in the accompanying drawings, in which FIG. 1 shows the diagram of the pulse sequence required for a 2D NOESY experiment, as modified according to the present invention;

FIGS. 3 and 4 show two regions of the spectrum illustrated in FIG. 2 on a larger scale, each both with and without reversing by means of a time reversal pulse; and FIGS. 5 to 10 show further diagrams of pulse sequences which have been modified according to the present invention.

Figure 1:
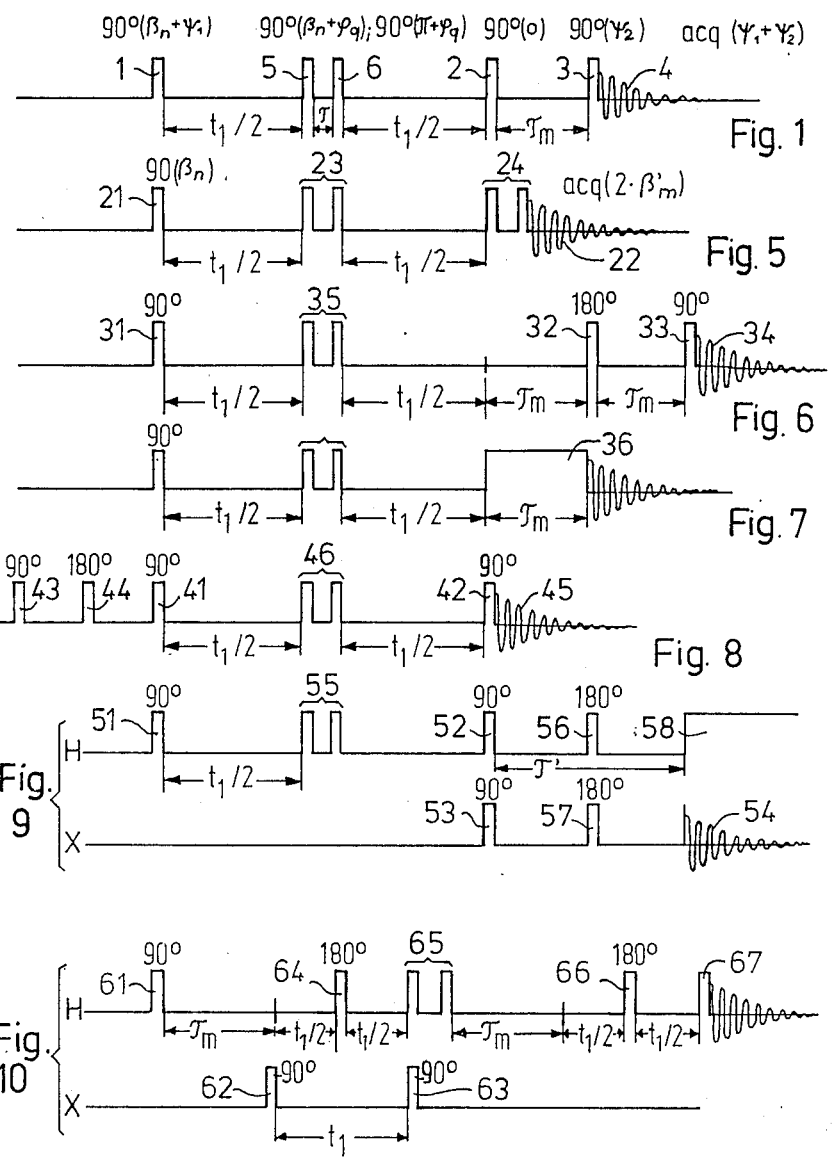

Referring now to the drawings, where like reference numerals designate like parts throughout the several views, FIG. 1 shows the diagram of a pulse sequence of the type employed in 2D NOE spectroscopy. Typical of this pulse sequence are three 90° pulses 1, 2, 3, of which first 90° pulse 1 excites the spin system of the specimen to be examined, second 90° pulse 2 repeats the excitation following an evolution period $t_1$ in order to identify the influence of spin-spin couplings, while third 90° pulse 3 terminates a mixing period $\tau_m$, which follows second 90° pulse 2. Following third 90° pulse 3, the resonance signal is received and recorded as an interferogram 4. The RF oscillation of the first and last 90° pulses has phase positions $\psi_1$ and $\psi_2$, respectively, relative to 90° pulse 2 which appears at the end of evolution period $t_1$, while the phase-sensitive rectification of interferogram 4 with a phase $\psi_1 + \psi_2$ radio frequency signal alternately assumes the values of 0 and $\pi$.

According to the present invention, a time reversal (TR) pulse is inserted between the first two 90° pulses, which define evolution period $t_1$; in the illustrated practical example, the TR pulse consists of two portions, i.e. of two 90° pulses 5 and 6, which are spaced at a chronological interval $\tau$ one from the other, each being spaced $t_{1/2}$ from adjacent 90° pulses 1 and 2, respectively. The RF oscillation of first 90° pulse 5 has a phase angle of $\beta_n + \phi_q$, while the RF oscillation of second 90° pulse 6 has a phase position of $\pi + \phi_q$. Both 90° pulses 5 and 6 produce the effect of a pulse which causes the spin moments to twist about an angle $\beta_n$ and whose phase is shifted $\phi_q$. Moreover, in the pulse sequence illustrated in FIG. 1, the phase angle of the first 90° pulse is shifted by $\beta_n$, so that the RF oscillation of this pulse has a phase angle of $\beta_n + \psi_1$.

Phase angle $\beta_n$ is determined by the assumed maximum number $N-1$ of coupling partners of each relevant spin in the specimen. Phase angle $\beta_n$ is altered in increments of $\pi/N$, so that $$\beta_n = n \frac{\pi}{N}$$

where $n = 0, 1, 2, \ldots, N-1, N+1, \ldots, 2N-1$ is applicable for $2N-1$ successive excitations. This phase cycle for $\beta_n$ is derived with consideration being given to the multiple quantum coherences (MQC) that are excited by 90° pulse 5 with phase $\beta_n + \phi_q$ of the time reversal pulse. The multiple quantum coherences must be combined in the ratio of $$B_p = \frac{(-1)^p}{12} (3p^2 - K^2 - \tfrac{1}{4}).$$

In this equation, K represents the number of highest actually present MQC, while p represents a current value between 0 and K. $B_p$ results in the weight for the multiple quantum coherence of order p. If it is desired that J couplings or spins having $K-1$ or fewer J couplings be refocussed, phase $\beta_n$ must be increased in increments of $\pi/N$, where $N > K$. The weightings for the individual increments of the $\beta$ cycle are obtained through a Fourier transformation of values $B_p$, i.e.

$$W_n = \tfrac{1}{2} B_0 + \sum_{p=1}^{K} B_p \cos(p\beta_n) - \tfrac{1}{2} B_n \cos(K\beta_n) \delta_{K,N}.$$

In the above equation, as already indicated, $n = 0, 1, 2, \ldots, N-1, N+1, \ldots, 2N+1$.

For the most sensitive case, $N = K$, it will be found that $$W_n = \frac{N}{8} (-1)^n \left[ \cos\left(\frac{n\pi}{2N}\right) \right]^{-2}.$$

Calculated values for phase angles $\beta_n$ and the corresponding weightings $W_n$ for $N = K = 4$ are indicated in the following table. Phase $\phi_q$ must pass through the three values 0, 2/3 and 4/3, independently thereof.

| n | 0 | $\pi/4$ | $\pi/2$ | $3\pi/4$ | $5\pi/4$ | $3\pi/2$ | $7\pi/4$ |
|---|---|---|---|---|---|---|---|
| $W_n$ | 0.500 | $-0.5860$ | 1.000 | $-3.414$ | $-3.414$ | 1.000 | $-0.586$ |

Consequently, the pair of pulses 5, 6 which form the time reversal pulse can thus also be viewed as being a multiple quantum filter. The above-described phase cycle is then a combination of p-quantum-filtered spectra having weights of $$\frac{1}{12} (3p^2 - N^2 - \tfrac{1}{4})$$

for $0 \leq p \leq N$ equivalent. The above-described phase cycle for $\beta_n$ selects only those coherence transmission paths $\Delta_p$ in which $\Delta_p = 0$ results in refocussing of the scalar couplings. It is therefore necessary for portion $\Delta_p = 0$ to be selected by means of an additional phase cycle of the entire time reversal pulse. The three-step cycle $\phi_q = 0, 2\pi/3, 4\pi/3$ is employed for this purpose.

As already indicated, phases $\psi_1$ and $\psi_2$ number among customary NOESY experiments. Their cyclical variation is employed to suppress axial lines ($\psi_1 = 0, \pi$), as well as for single-quantum coherence between mixing period $\tau_m$ ($\psi_2 = 0, \pi$). In the case of NOESY with time reversal (NOESY-TR), zero quantum suppression, which poses a known problem in the case of conventional NOE spectroscopy, is superfluous as a result of the fact that the J couplings have been refocussed. Of course, the time proportional phase increase (TPPI) method can also be applied to the first pulse in the customary manner in order to separate positive and negative frequencies and obtain pure 2D absorption lines.

Mention should, however, be made of the fact that the NOESY-TR experiment also poses certain disadvantages. As compared with conventional NOESY, there is a loss of sensitivity on the order of around a factor of 2.5, whose precise value depends upon the number K of coupled spins. Moreover, undesirable cross peaks can occur in positions $(\omega_1, \omega_2) = (\tfrac{1}{2}[\Omega_k + \Omega_1], \Omega_m)$ in coupled spin systems. Furthermore, spin $I_m$ can belong either to the same spin system as $I_k$ and $I_l$ or can have a cross relaxation relative to $I_k$ or $I_l$. However these lines can easily be differentiated from the desired $\omega_1$-decoupled lines, as they have a multiplet structure of the opposite phase relative to $\omega_1$. If necessary, the undesired lines can also be suppressed in a manner that is similar to suppression of zero quantum coherence in the case of NOESY.

Figure 2:
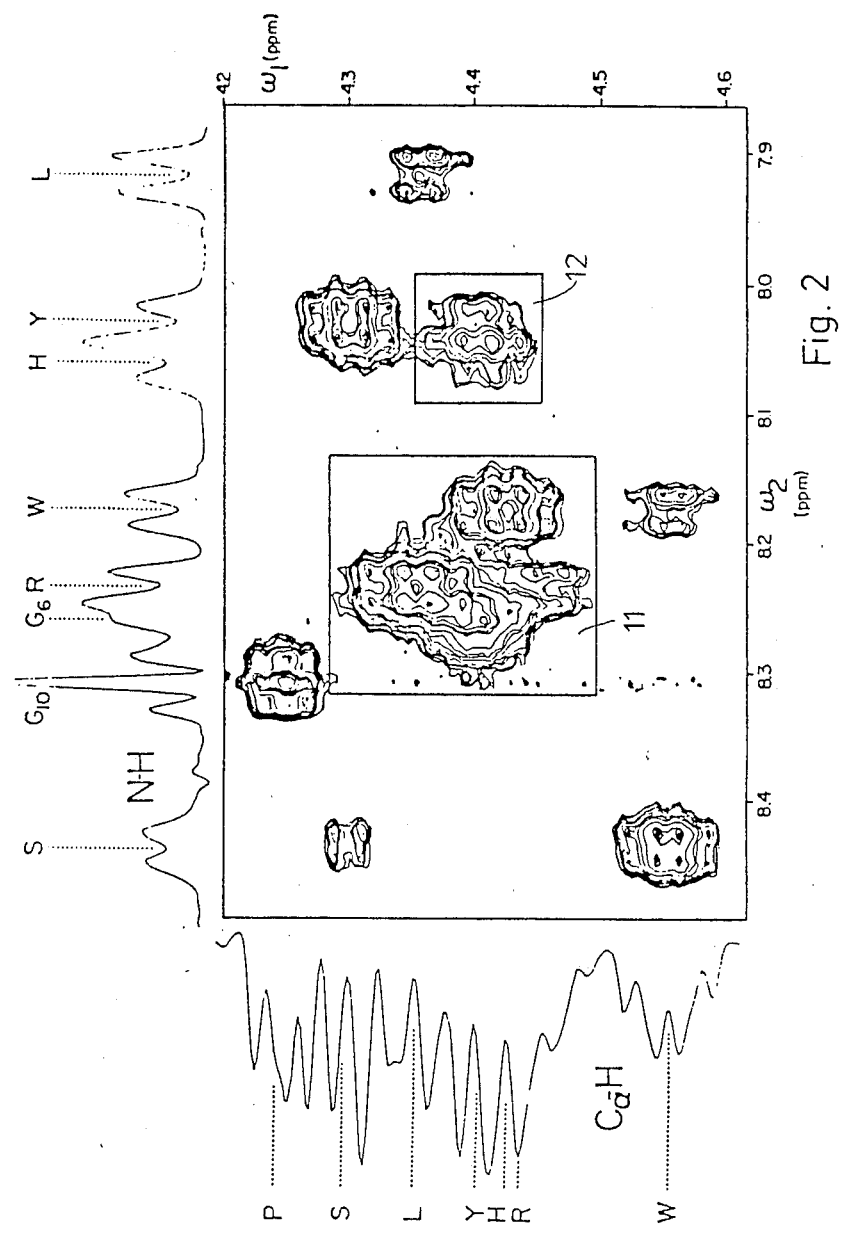
FIG. 2 shows a representation of a 2D NOE spectrum of deca-peptide-LHRH.

FIGS. 2 through 4 clearly illustrate the effect of the method according to the present invention when recording a 2D NOE spectrogram of deca-peptide-LHRH or p-Glu-His-Trp-Ser-Tyr-Gly[6]-Leu-Arg-Pro-Gly[10]-NH$_2$. The conventional NOESY diagram according to FIG. 2 displays heavy overlapping of the cross peaks in the two outlined regions 11, 12, which impedes allocation of these lines and preclude quantitative analysis of the NOE spectrogram. In FIGS. 3a and 4a, regions 11 and 12 are again shown, on a larger scale. The decoupling in the $\omega_1$ axis that was achieved through the application of the method according to the present invention produces the 2D spectrograms 13 and 14 which are shown in FIGS. 3b and 4b. A comparison between diagrams 11 and 13, on the one hand, and 12 and 14, on the other, clearly shows the elimination of the line splitting in the $\omega_1$ axis, which now permits clear identification of the individual lines, and thus unmistakable interpretation of the spectrogram. The illustrated spectrograms show the NH-C$_\alpha$H spectral region of a 300 MHz NOE spectrum. The recording was effected with 700 $t_1$ scans for a 2K×2K data matrix packed with zeroes.

The major significance of the method according to the present invention results, among other things, from the fact that quantitative analysis of a NOESY spectrum, i.e. measurement of the signal amplitudes of the cross peaks, supplies direct information regarding atomic spacing. This information is of immense importance in understanding the tertiary structures of biological macromolecules. However quantitative analysis of this type is not possible if there is overlapping of the cross peaks in the conventional NOESY spectrum. The NOESY-TR method according to the present invention represents what is thus far the only method through which the desired information can even be obtained in the case of otherwise overlapping cross peaks.

As already indicated above, the method according to the present invention is suitable not only for reversing the evolution in the case of a J coupling in conjunction with 2D NOE spectroscopy, but can also be employed for other purposes. In fact, the time reversal pulse with the associated phase shifts, more briefly termed the TR element, can be inserted into a plurality of different pulse sequences in which homonuclear or heteronuclear decoupling is desired. FIGS. 5 through 10 show pulse sequences of the type that could be employed in other experiments.

FIG. 5 provides a general illustration of a pulse sequence for the observation of (homonuclear) exchanges in which, for observation of the exchanges, a 90° excitation pulse 21 is followed by an evolution period $t_1$ before the interferogram 22 is recorded after irradiation with a pair of pulses 24, which form a known double quantum filter having an independent phase cycle. At the end of one half of the evolution period $t_1/2$, TR element 23 is inserted which, in turn, consists of two 90° portions having phase shifts of $\beta_n + \phi_q$ and $\pi + \phi_q$, in the above-described manner. Correspondingly, 90° pulse 21 that precedes TR element 23 has a phase shift of $\beta_n$. This experiment supplies a homonuclear J-correlated 2D spectrum without the non-informational and disturbing diagonal signals that are otherwise present (uncorrelated signals at frequencies $\omega_1 = \omega_2$).

In the case of J-correlated 2D spectroscopy (COSY), mixing period $\tau_m$ is not terminated by a further 90° pulse at the end of evolution period $t_1$, which, in turn, follows a 90° excitation pulse 31; instead, a 180° pulse 32 follows after one half of the mixing period $\tau_m/2$, with 180° pulse 32 being followed by a further 90° pulse 33 at the end of mixing period $\tau_m$, and with further 90° pulse 33 then being followed by recording of an interferogram 34. Here, too, according to the present invention, a TR element 35 is also inserted after one half of the evolution period $t_1/2$, as illustrated in FIG. 6. Likewise, 90° pulse 31, which precedes TR element 35, is, in turn, subjected to phase shift $\beta_n$. The same also applies with respect to the totally correlated 2D spectrogram (TOCSY) according to FIG. 7, in which a saturation pulse 36 is irradiated only during evolution period $\tau_m$.

FIG. 8 shows a diagram of the pulse sequence employed for recording a multiple quantum spectrogram. Here, too, evolution period $t_1$ is again initiated by a first 90° pulse 41 and terminated by a second 90° pulse 42. As opposed to the previously discussed pulse sequences, however, a further 90° pulse 43 and a 180° pulse 44 are inserted prior to 90° pulse 41, which initiates evolution period $t_1$. An interferogram 45 is recorded following final 90° pulse 42. Here, too, according to the present invention, a TR element 46 is again inserted into the pulse sequence after one half of the evolution period $t_1/2$. In this case, it is necessary for not only 90° pulse 41, which initiates the evolution period, to be subjected to a phase shift of $\beta_n$, but also the other pulses 43 and 44, which precede the TR element.

And, finally, FIGS. 9 and 10 show pulse sequences of the type that are employed for investigating heteronuclear couplings and for indirect observation of magnetic resonance. In the case of the pulse sequence that is illustrated in FIG. 9, the H spins of the specimen to be examined are excited by two 90° pulses 51, 52, with an evolution period $t_1$ being initiated by 90° pulse 51 and terminated by 90° pulse 52. Together with second 90° pulse 52, a 90° pulse 53 is also irradiated for those X atoms of the spin system that are coupled with the H atoms. These X atoms can consist of carbon −13, for example. The interferogram 54 of the X atoms which is recorded after chronological interval $\tau'$ indicates the degree to which the X atoms have been excited through heteronuclear coupling by the previously excited H atoms during evolution period $t_1$. Here, too, according to the present invention, a TR element 55 is again inserted between the two 90° pulses 51, 52, which define evolution period $t_1$, and the phase of first 90° pulse 51 is modified in the previously described manner. Chronological interval $\tau'$, in which 180° pulses 56, 57 are centered, is employed, in the customary manner, for refocussing the antiphase signals prior to activation of decoupler 58.

In the case of the indirect spectroscopy that is illustrated in FIG. 10, both classes of atoms H and X are excited by one 90° pulse 61 or 62, respectively, one following the other, during a mixing period $\tau_m$. The chronologically subsequent 90° pulse which is employed for excitation of the X atoms is followed by a further 90° pulse 63 following evolution period $t_1$, while the first class of atom H to be excited is irradiated with a 180° pulse 64, which follows the first 90° pulse after a period $\tau_m + t_1/2$. In indirect spectroscopy, the first class of atom H would normally be observed at time $t_1/2 + \tau_m$ following 180° pulse 64. If the method according to the present invention is employed, however, a TR element 65 is inserted at time $t_1/2$ following 180° pulse 64, with TR element 65 thus being inserted at the same time as 90° pulse 63, which terminates chronological interval $t_1$ and which is irradiated onto the other class of atom C. This TR element 65 is followed at a chronological interval of $\tau_m + t_1/2$ by a further 180° pulse 66. An interferogram 67 is recorded for first class of atom H at time $t_1/2$ following irradiation of last 180° pulse 66. If the sum of times $\tau_m + t_1/2 + t_1/2 + \tau_m + t_1/2 + T_1/2 = 2(t_1 + \tau_m)$ is viewed as being the total evolution period from first 90° excitation pulse 61 to the recording of interferogram 67, it can be seen that TR element 65 is again centered in the total evolution period, as its chronological interval from 90° excitation pulse 61 amounts to $\tau_m+t_1$. Here, too, it is obvious that the two 90° and 180° pulses 61 and 64, which precede TR element 65, have an RF oscillation phase shift that amounts to a phase angle of $\beta_n$.

The preceding examples demonstrate that the principle of the present invention can be employed with numerous known pulse groups with which spin systems can be excited for the purpose of recording spectrograms and, in particular, 2D spectrograms. In particular, it is possible for the TR element to be inserted in order to achieve $\omega_1$ decoupling in all homonuclear or heteronuclear 2D experiments in which the components which are in phase relative to the homonuclear couplings are selected at the end of the evolution period.

The method according to the present invention can be implemented with all nuclear magnetic resonance spectrometers that have a generator for producing successive RF pulses with variable timing, as well as a variable phase position of the RF oscillation relative to a coherent reference oscillation, i.e. with all modern pulse Fourier transform spectrometers.

The present invention has been described above on the basis of preferred practical examples thereof. Obviously, many modifications and variations of the present invention are possible in the light of the above teachings. It should therefore be understood that, within the scope of the appended claims, the present invention may be practiced otherwise than as specifically described. In particular, individual characteristics of the invention can be employed individually or in combination one with the other.

What is claimed is:

1. A method for recording the nuclear magnetic resonance spectra of molecular spin systems between which there is an interactive effect in which said spin systems are excited by means of a 90° pulse and the resonance signals of the excited spin systems are not observed until the end of an evolution period $t_1$ that follows the 90° pulse, wherein said spin system is irradiated with a time reversal pulse after one half of the evolution period ($t_1/2$), with said time reversal pulse causing the spin moments to rotate by a flip angle $\beta_n$ and their RF oscillation to have a phase shift of $\phi_q$ relative to a reference phase, while the RF oscillation of all pulses that precede said time reversal pulse have a phase shift of $\psi+\beta_n$ relative to said reference phase, in which phase shift $\psi$ represents either 0 or $\pi$ and $\beta_n$ coincides with said flip angle of said time reversal pulse and is determined by the maximum number N of coupled spins in said spin system, in accordance with the equation $$\beta_n = n\frac{\pi}{N}$$

wherein $n=0, 1, 2, \ldots, N-1, N+1, \ldots, 2N-1$ while $\phi_q$ independently of $\beta_n$ assumes one of the values $$\phi_q = q\frac{2\pi}{3},$$

wherein $q=0, 1, 2$, and in that signals which are received on the basis of $3(2N-1)$ excitations, are multiplied by a weighting factor of $$W_n = \tfrac{1}{2} B_0 + \sum_{p=1}^{K} B_p\cos(p\beta_n) - \tfrac{1}{2} B_K\cos(K\beta_n) \delta_{K,N},$$

and then added together to form a resulting signal, which weighting factor is the Fourier transformation of the factors $$B_p = \frac{(-1)^p}{12} (3p^2 - K^2 - \tfrac{1}{2}),$$

in which K represents the highest number of couplings that are actually present in said spin system and p represents a continuously changing integer between 0 and K, so that $$B_0 = \frac{-(2K^2 + 1)}{24} \text{ and } B_K = (-1)^K \frac{(4K^2 - 1)}{24},$$

while $\delta_{K,N}$ has a value of 1 if $N=K$, and otherwise is zero.

2. The method according to claim 1, wherein said time reversal pulse has a first portion in the form of a 90° pulse having a phase of $\beta_n+\phi_q$ and a second portion which follows said first portion in the form of a 90° pulse having a phase of $\pi+\phi_q$.

3. The method according to claim 1 or 2, wherein pulse sequences are employed which are suitable for recording two-dimensional nuclear magnetic resonance spectra and have an inserted time reversal pulse, and in which the phase of the RF oscillation of the excitation pulse that precedes the time reversal pulse is shifted by angle $\beta_n$.

4. The method according to claim 3, wherein the pulse sequence is $$90°(\beta_n+\psi_1)-\tfrac{1}{2}t_1-90°(\beta_n+\phi_q)-\tau-90°(\pi+\phi_q)-\tfrac{1}{2}t_1-90°(0)-\tau_m-90°(\psi_2)-\text{acq.}(\psi_1+\psi_2),$$

wherein $\psi_1$ and $\psi_2$ are alternatively 0 and $\pi$ in a cycle that is independent of $\beta$ and $\phi$ and $\tau_m$ is the variable mixing time of NOESY experiments.

5. The method according to claim 3 for investigation of spin systems with heteronuclear coupling, in which a first kind of nuclei is directly excited by a first pulse sequence and then the excitation by coupling of a second kind of nuclei is examined by means of a second pulse sequence, wherein the time reversal pulse is inserted into said first pulse sequence.

6. The method according to claim 3 for indirect investigation of spin systems with heteronuclear coupling in which a first kind of nuclei is excited by means of a first pulse sequence and a second kind of nuclei is excited by means of a second pulse sequence in such a manner that a first 180° pulse following a first 90° pulse of said first pulse sequence is centered between two 90° pulses of said second pulse sequence, wherein said time reversal pulse is inserted in said first pulse sequence at a location that is in time coincidence with said second 90° pulse of said second pulse sequence, wherein said time reversal pulse is followed by a further 180° pulse after a time interval that is identical to the time interval between said first 90° pulse and said first 180° pulse, and wherein scanning of the resonance signal provided by said first kind of nuclei starts after a time interval from said further 180° pulse that is identical to the time interval between said first 180° pulse and said time reversal pulse, so that said time reversal pulse is centered between said first 90° pulse and start of said signal scanning.

7. The method according to claim 2 in which the second portion of the time reversal pulse follows the first portion of the time reversal pulse in a time interval $\tau$ which is short relative to the evolution period.

* * * * *